(12) United States Patent
Tuttle

(10) Patent No.: US 6,208,524 B1
(45) Date of Patent: Mar. 27, 2001

(54) ELECTRONIC APPARATUS, BATTERY POWERABLE APPARATUS, AND RADIO FREQUENCY COMMUNICATION DEVICE

(75) Inventor: Mark E. Tuttle, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/122,474

(22) Filed: Jul. 23, 1998

(51) Int. Cl.⁷ .................................................. H05K 1/18
(52) U.S. Cl. ......................... 361/782; 361/767; 361/768; 361/743; 361/760; 361/761; 361/763; 174/52.1; 174/52.3; 174/260; 257/787; 257/692
(58) Field of Search .................................... 361/782, 767, 361/768, 743, 760, 761, 763, 764, 749, 750, 751; 174/52.4, 52.2, 52.3, 260; 257/787, 779, 692

(56) References Cited

U.S. PATENT DOCUMENTS

| | | | |
|---|---|---|---|
| 4,894,663 | * 1/1990 | Urbish et al. | 343/702 |
| 5,289,034 | * 2/1994 | Hundt | 257/678 |
| 5,521,794 | * 5/1996 | Hargrave et al. | 361/814 |
| 5,682,293 | * 10/1997 | Horejs, Jr. et al. | 361/737 |
| 5,767,446 | * 6/1998 | Ha et al. | 174/52.4 |
| 5,914,862 | * 6/1999 | Ferguson et al. | 361/737 |
| 5,939,778 | * 8/1999 | Boutin et al. | 257/678 |
| 5,963,429 | * 10/1999 | Chen | 361/764 |
| 5,981,102 | * 11/1999 | Grigg et al. | 429/157 |
| 5,998,061 | * 12/1999 | Lake | 429/157 |
| 5,999,410 | * 12/1999 | Weiler | 361/749 |
| 6,025,087 | 2/2000 | Trosper | 429/92 |
| 6,030,423 | * 2/2000 | Lake | 29/623.4 |
| 6,048,848 | 4/2000 | Dando et al. | 514/171 |
| 6,049,463 | * 4/2000 | O'Malley et al. | 361/760 |
| 6,080,932 | * 6/2000 | Smith et al. | 174/52.4 |
| 6,081,243 | * 6/2000 | Lake | 343/873 |
| 6,100,804 | * 8/2000 | Brady et al. | 340/572.7 |
| 6,130,602 | 10/2000 | O'Toole et al. | 340/10.33 |

* cited by examiner

Primary Examiner—Jayprakash N. Gandhi
Assistant Examiner—David Foster
(74) Attorney, Agent, or Firm—Wells, St. John, Roberts, Gregory & Matkin P.S.

(57) ABSTRACT

Electronic apparatus, battery powerable apparatus, and radio frequency communication devices are disclosed. In but one implementation, an electronic apparatus comprises a substrate having a component mounted thereto. An encapsulant mass is received over and adheres to the gasifiable component and to the substrate. An opening is formed through the substrate and extends to the encapsulant mass. In another considered implementation, an electronic apparatus comprises a substrate having a component mounted thereto, with the component comprising a lateral periphery. An encapsulant mass is received over and adheres to the gasifiable component and to the substrate. An opening extends through the substrate from a location proximate the component within a region bounded by the component lateral periphery to externally of the substrate.

19 Claims, 4 Drawing Sheets

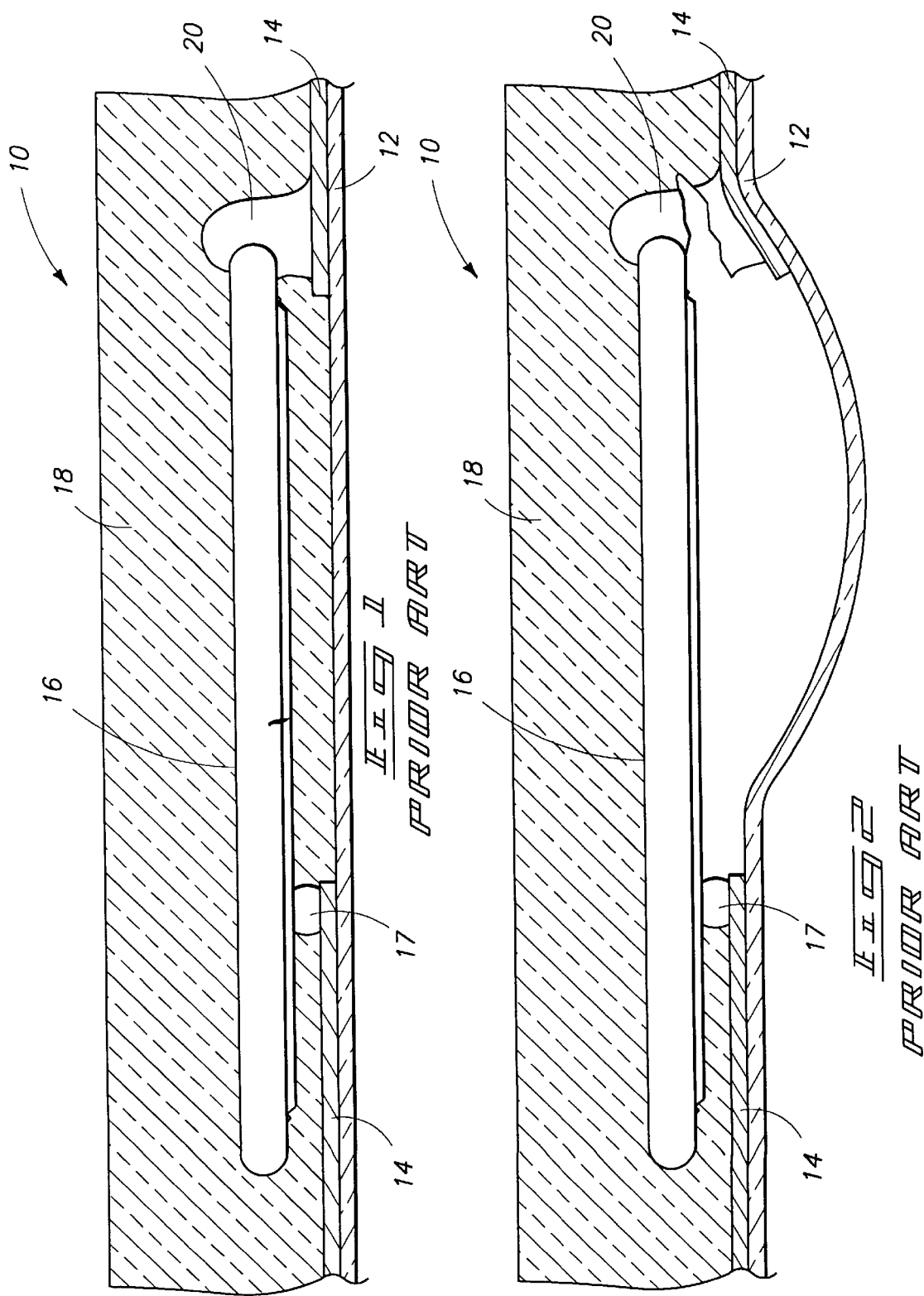

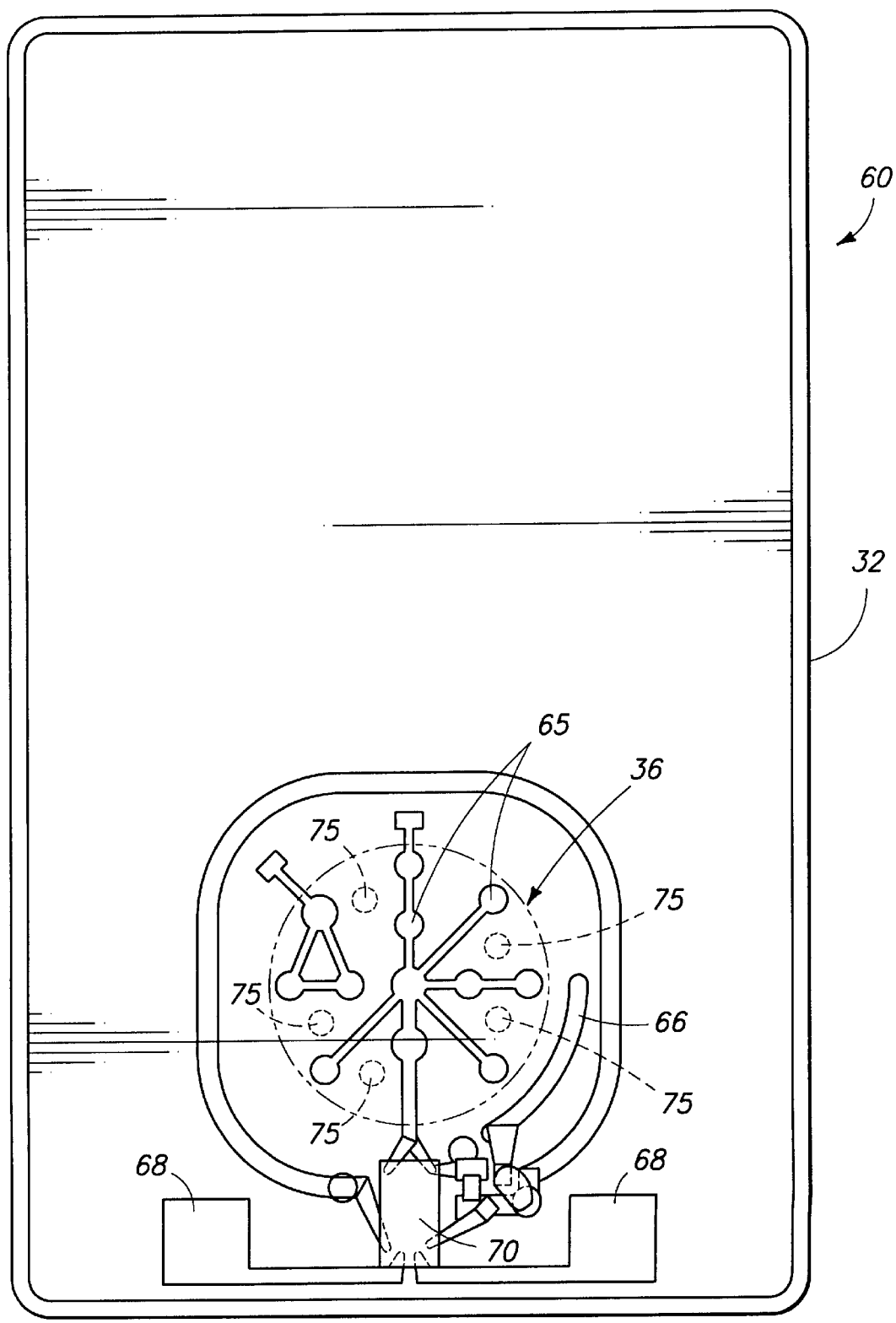

ELECTRONIC APPARATUS, BATTERY POWERABLE APPARATUS, AND RADIO FREQUENCY COMMUNICATION DEVICE

TECHNICAL FIELD

This invention relates to electronic apparatus, including battery powerable apparatus and radio frequency communication devices.

BACKGROUND OF THE INVENTION

Electronic devices come in many sizes and shapes. One type of device can be formed by mounting electronic components onto a substrate, such as a flexible polyester sheet. Some substrates can be quite small (i.e., credit card size or less), such that the resultant device formed is also small. There is generally an emphasis on decreasing overall device dimensions while increasing the overall performance and/or capabilities of a device. Classes of devices finding increasing use are active and passive radio frequency communication devices capable of tracking an object.

An example electronic device, and problems associated therewith which motivated the invention, are described with reference to FIGS. 1 and 2. An electronic device 10 includes a flexible polyester substrate 12 having conductive printed thick film ink traces 14 printed or otherwise formed thereon in a desired pattern. A thin profile battery 16 is effectively bonded to substrate 12 by cured conductive adhesive interconnections 17 and 20 which conductively connect portions of battery 16 to different portions of conductive traces 14. Thin profile batteries comprise batteries that have thickness dimensions which are less than a maximum linear dimension of their anode or cathode. One type of thin profile battery is a button-type battery. Such batteries, because of their compact size, permit electronic devices to be built which are very small or compact.

An encapsulant mass 18, for example insulative epoxy, is received over and adheres to thin profile battery 16 and substrate 12. A typical thickness for flexible substrate 12 is 5 mils, with an example thickness for printed thick film 14 being between 1 and 1.5 mils. An example thickness for encapsulant mass 18 is 90 mils.

At certain elevated temperatures occurring either during test, operation or storage, material inside of thin profile battery 16 can be caused to outgas into the surrounding encapsulant mass 18. The outgassing material can migrate through encapsulant mass 18 around or along cracks, crevasses and grain boundaries to a point where it reaches polyester film 12. The soft or more flexible nature of substrate 12 typically compared to the encapsulant mass 18 can cause the substrate and encapsulant mass to displace from one another the result of the expanding gas, particularly below battery 16. Accordingly, the gas can cause bowing or bubbling of the polyester film outwardly away from the encapsulant. Under such circumstances, the bowing or bubbling as a minimum creates an undesired appearing product. Even worse as shown in FIG. 2, the bubbling can cause rupturing of one or more conductive bonds between the printed thick film and battery as the printed thick film also pulls away from the encapsulant mass with the polyester film.

It would be desirable to develop structures which minimize or reduce problems associated with material which outgases from a gasifiable component received within an encapsulant mass.

SUMMARY OF THE INVENTION

Electronic apparatus, battery powerable apparatus, and radio frequency communication devices are disclosed. In but one implementation, an electronic apparatus comprises a substrate having a component mounted thereto. An encapsulant mass is received over and adheres to the gasifiable component and to the substrate. An opening is formed through the substrate and extends to the encapsulant mass. In another considered implementation, an electronic apparatus comprises a substrate having a component mounted thereto, with the component comprising a lateral periphery. An encapsulant mass is received over and adheres to the gasifiable component and to the substrate. An opening extends through the substrate from a location proximate the component within a region bounded by the component lateral periphery to externally of the substrate.

BRIEF DESCRIPTION OF THE DRAWINGS

Preferred embodiments of the invention are described below with reference to the following accompanying drawings.

FIG. 1 is a diagrammatic sectional view of a prior art radio communication device, and is described in the Background section above.

FIG. 2 is a view of the same FIG. 1 radio communication device shown in a damaged condition.

FIG. 7 is a diagrammatic top view of a radio frequency communication device in accordance with the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 3:
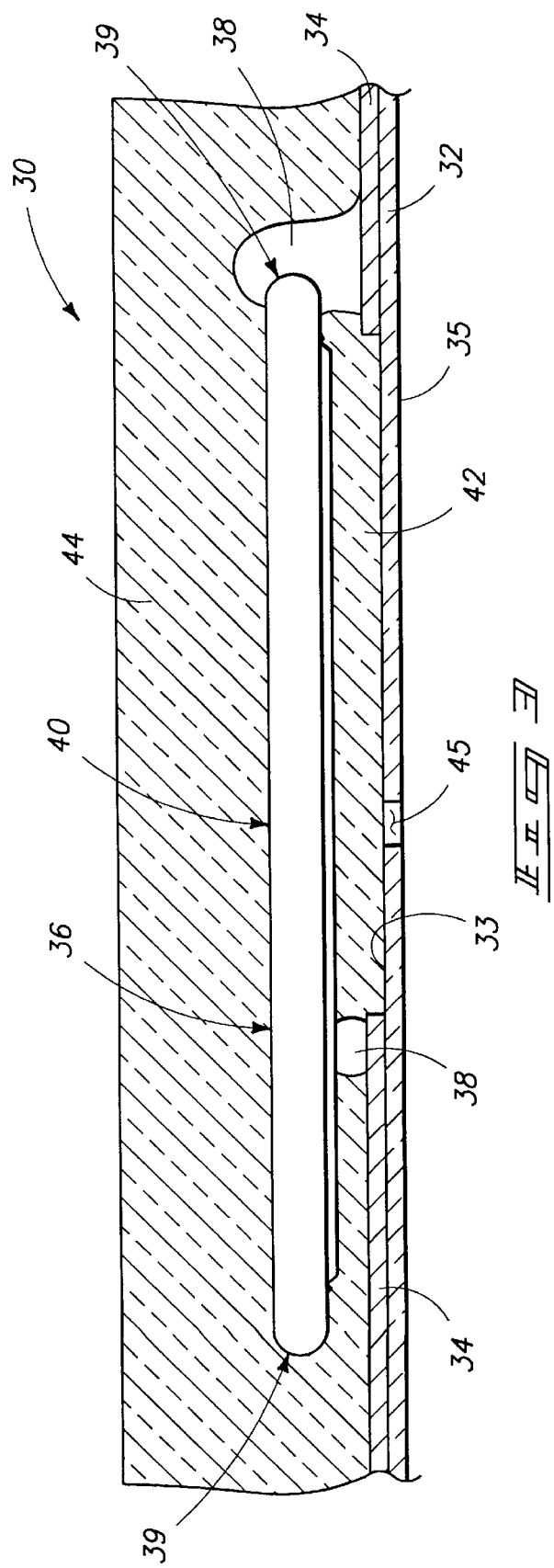
FIG. 3 is a diagrammatic sectional view of an electronic apparatus in accordance with the invention.
Figure 4:
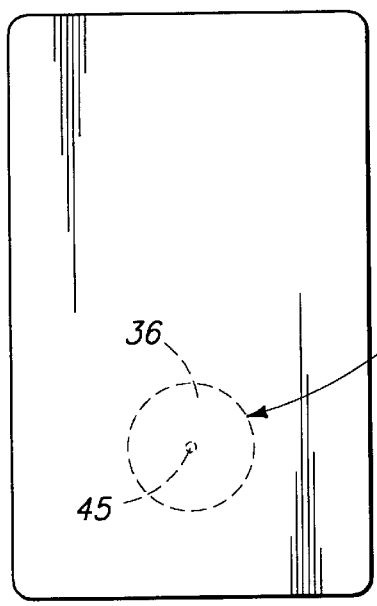
FIG. 4 is a simplified diagrammatic top view of an electronic apparatus in accordance with the invention.

Referring initially to FIGS. 3 and 4, an electronic apparatus 30 comprises a flexible substrate sheet 32, such as a polyester sheet, approximately 1 to 1.5 mils thick. Substrate 32 comprises an inner surface 33 and an outer surface 35. Conductive paths 34, preferably in the form of printed thick film ink traces, are formed on inner surface 33 of substrate 32. A gasifiable component 36 is mounted relative to substrate 32. In the illustrated and preferred embodiment, gasifiable component 36 comprises a thin profile battery, such as a button-type battery, conductively bonded relative to conductive traces 34 through conductive interconnects 38. An example interconnecting material is electrically conductive epoxy. Although principally motivated from addressing outgassing problems relative to batteries or other components, the artisan will appreciate applicability of the preferred and other embodiments relative to other possible uses, with the invention only being limited to the accompanying claims appropriately interpreted in accordance with the Doctrine Of Equivalents.

Battery 36 comprises a lateral or radial center 40, and a lateral periphery 39. Battery 36 is spaced from substrate 32 by a distance substantially equal to the thickness of conductive traces 34 and the left illustrated conductive bonding interconnect 38. An encapsulant mass 44 (i.e., insulative epoxy) is received over and adheres to gasifiable component 36 and to substrate 32, including inner substrate surface 33. Encapsulant mass 44 has a greater thickness than substrate 32, with an example thickness being 90 mils. Encapsulant mass 44 is received intermediate substrate 32 and battery 36. More specifically, a void 42 is defined intermediate substrate 32 and battery 36, with such void being substantially completely filled by encapsulant mass 44. Alternately, void 42 might only be partially filled with encapsulant or void of encapsulant.

An opening is formed through the substrate and extends to the encapsulant mass in the illustrated preferred embodiment. In the same and alternate embodiments, the opening extends through the substrate from a location proximate the component within a region bounded by the component lateral periphery regardless of extending to the encapsulant mass, and extends to externally of the substrate. In the specifically depicted embodiment, an opening 45 is formed through substrate sheet 32, extending from or between outer substrate surface 35 to inner substrate surface 33, and accordingly to encapsulant mass 44 received beneath battery 36. Opening 45 preferably has a diameter from 1 mil to 5 mils, and in the illustrated example is located more proximate device component center 40 than device periphery 39. Further, it is received entirely within the lateral confines 39 of device component 36. Alternate but less preferred openings might also be formed. By way of example only, an opening to externally of the substrate 32 might be formed from void 42 and extend at an angle other than 90° relative to substrate 32. Further alternately by way of example only, an opening could extend substantially perpendicular to the thickness dimension of substrate 32 to some location externally of the substrate, either within or without the region bounded by battery lateral periphery 39. Such opening(s) can function as a vent for gas emanating from battery 36 to flow outwardly of device 30, and thereby prevent bowing or other displacement of substrate 32 relative to encapsulant mass 44.

Figure 5:
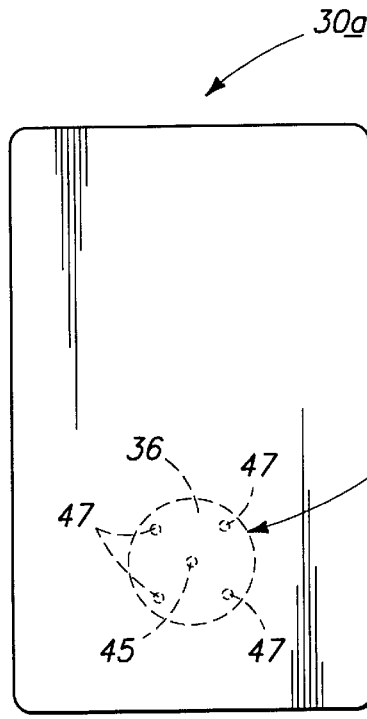
FIG. 5 is a simplified top view of an alternate electronic apparatus in accordance with the invention.

An alternate embodiment battery powerable electronic apparatus is depicted with reference to FIG. 5. Like numerals from the first described embodiment are utilized where appropriate, with differences being indicated by the suffix "a" or with different numerals. Apparatus 30a includes a plurality of openings 45 and 47 extending through substrate 32 to the encapsulating mass. All illustrated openings are shown as being received within battery lateral periphery 39, with openings 47 being formed more proximate periphery 39 than to center 40. Most preferred in accordance with the invention is to provide a plurality of openings which are received within the confines of the gasifiable component device periphery.

Figure 6:
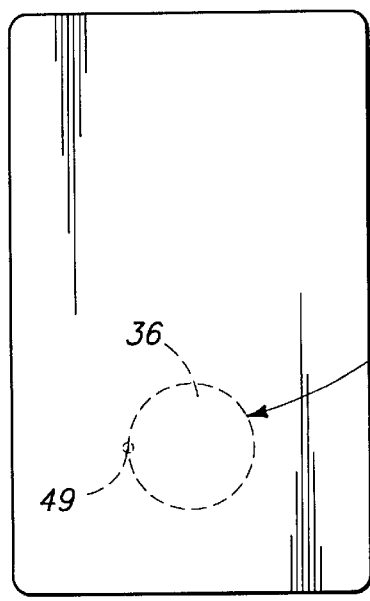
FIG. 6 is a simplified top view of another alternate electronic apparatus in accordance with the invention.

FIG. 6 illustrates an alternate embodiment 30b depicting positioning of an opening 49 formed entirely through substrate 32 which is partially received within and without lateral confines 39 of the gasifiable component. Alternately but even less preferred would be positioning of the vent hole(s) externally of any gasifiable component.

FIG. 7 depicts an exemplary battery powerable apparatus and electric circuit in accordance with an aspect of the invention in the form of a radio frequency communication device 60. In such example, substrate 32 preferably comprises a flexible circuit substrate, with nodes 65 and 66 constituting a portion of the series of conductive paths printed or otherwise formed of thick film ink on inner surface 33 of flexible substrate 32. Such conductive paths includes antenna portions 68. At least one, and preferably only one, integrated circuit chip 70 is mounted relative to substrate 32 and in electrical connection with a first portion of the substrate conductive paths. Mounting is preferably with electrically conductive epoxy, such as described above. A plurality of substrate openings 75 are formed through substrate 32 within the lateral confines of battery 36.

An exemplary single integrated circuit chip is described in U.S. patent Ser. No. 08/705,043, which names James O'Toole, John R. Tuttle, Mark E. Tuttle, Tyler Lowrey, Kevin Devereaux, George Pax, Brian Higgins, Shu-Sun Yu, David Ovard, and Roger Rotzoll as inventors, which was filed on Aug. 29, 1996, and is assigned to the Assignee of this patent application. The entire assembly 60 preferably is encapsulated in and comprises an insulative epoxy encapsulant material. Example constructions and methods for providing the same are described in a) U.S. patent application Ser. No. 09/026,250 entitled "Battery Mounting Apparatuses, Electronic Devices, And Methods Of Forming Electrical Connections", which names Ross S. Dando, Rickie C. Lake, and Krishna Kumar as inventors, and was filed on Feb. 19, 1998, and b) U.S. patent application Ser. No. 09/026,247 entitled "Battery Mounting And Testing Apparatuses, Methods of Forming Battery Mounting and Testing Apparatuses, Battery-Powered Test Configured Electronic Devices, And Methods Of Forming Battery-Powered Test Configured Electronic Devices", which names Scott T. Trosper as inventor, and which was filed on Feb. 19, 1998, both of which are assigned to the Assignee of this patent application. Each of the above three referenced patent applications is fully incorporated hereby reference.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. An electronic apparatus comprising:
   a substrate;
   a gasifiable component mounted to the substrate;
   an encapsulant mass received over and adhering to the gasifiable component and to the substrate;
   an opening formed through the substrate and extending to the encapsulant mass; and
   wherein the component comprises a periphery, the opening being received at least partially outside the periphery.

2. An electronic apparatus comprising:
   a substrate;
   a gasifiable component mounted to the substrate;
   an encapsulant mass received over and adhering to the gasifiable component and to the substrate;
   an opening formed through the substrate and extending to the encapsulant mass; and
   wherein the component comprises a periphery, and further comprising a plurality of openings formed through the substrate and extending to the encapsulant mass, the plurality of openings being received within the component periphery.

3. An electronic apparatus comprising:
   a substrate;
   a gasifiable component mounted to the substrate;
   an encapsulant mass received over and adhering to the gasifiable component and to the substrate;

an opening formed through the substrate and extending to the encapsulant mass; and wherein the component comprises a periphery and a center, the opening being formed more proximate the periphery than the center.

4. An electronic apparatus comprising:

a substrate;

a gasifiable component mounted to the substrate, the gasifiable component comprising a periphery;

an encapsulant mass received over and adhering to the gasifiable component and to the substrate; and a plurality of openings formed through the substrate from a location proximate the component within a region bounded by the component periphery to externally of the substrate.

5. An electronic apparatus comprising:

a substrate;

a gasifiable component mounted to the substrate, the gasifiable component comprising a periphery;

an encapsulant mass received over and adhering to the gasifiable component and to the substrate;

an opening extending through the substrate from a location proximate the component within a region bounded by the component periphery to externally of the substrate; and wherein the component comprises a center, the opening being formed more proximate the periphery than the center.

6. A battery powerable apparatus comprising:

a substrate sheet comprising opposing inner and outer surfaces, the inner surface having conductive paths formed thereon;

a thin profile battery conductively bonded to the conductive paths;

an encapsulant mass received over and adhering to the thin profile battery and to the substrate inner surface;

an opening formed through the substrate sheet and extending from the outer substrate surface to the inner substrate surface; and wherein the battery comprises a periphery, and further comprising a plurality of openings formed through the substrate sheet and extending from the outer substrate surface to the inner substrate surface, the plurality of openings being received within the battery periphery.

7. A battery powerable apparatus comprising:

a substrate sheet comprising opposing inner and outer surfaces, the inner surface having conductive paths formed thereon;

a thin profile battery conductively bonded to the conductive paths;

an encapsulant mass received over and adhering to the thin profile battery and to the substrate inner surface;

an opening formed through the substrate sheet and extending from the outer substrate surface to the inner substrate surface; and wherein the battery comprises a periphery and a center, the opening being formed more proximate the periphery than the center.

8. A battery powerable apparatus comprising:

a substrate sheet comprising opposing inner and outer surfaces, the inner surface having conductive paths formed thereon;

a thin profile battery conductively bonded to the conductive paths, the battery comprising a periphery;

an encapsulant mass received over and adhering to the thin profile battery and to the substrate inner surface;

an opening extending through the substrate from the inner surface at a location proximate the thin profile battery within a region bounded by the battery periphery to the outer substrate surface within the region bounded by the battery periphery; and further comprising a plurality of openings formed through the substrate from the inner surface at a location proximate the thin profile battery within the region bounded by the battery periphery to the outer substrate surface within the region bounded by the battery periphery.

9. A battery powerable apparatus comprising:

a substrate sheet comprising opposing inner and outer surfaces, the inner surface having conductive paths formed thereon;

a thin profile battery conductively bonded to the conductive paths, the battery comprising a periphery;

an encapsulant mass received over and adhering to the thin profile battery and to the substrate inner surface;

an opening extending through the substrate from the inner surface at a location proximate the thin profile battery within a region bounded by the battery periphery to the outer substrate surface within the region bounded by the battery periphery; and wherein the battery comprises a center, the opening being formed more proximate the periphery than the center.

10. A battery powerable apparatus comprising:

a substrate sheet comprising opposing inner and outer surfaces, the inner surface having conductive paths formed thereon;

a thin profile battery conductively bonded to the conductive paths, the battery comprising a periphery;

an encapsulant mass received over and adhering to the thin profile battery and to the substrate inner surface;

an opening extending through the substrate from the inner surface at a location proximate the thin profile battery within a region bounded by the battery periphery to the outer substrate surface within the region bounded by the battery periphery; and wherein the battery comprises a center, the opening being formed more proximate the center than the periphery.

11. A radio frequency communication device comprising:

a substrate having conductive paths including an antenna formed thereon;

at least one integrated circuit chip mounted to the substrate and in electrical connection with a first portion of the substrate conductive paths;

a thin profile battery conductively bonded to a second portion of the conductive paths;

an encapsulant mass received over and adhering to the integrated circuit chip, to the thin profile battery and to the substrate;

an opening formed through the substrate and extending to the encapsulant mass; and wherein the battery comprises a periphery, and further comprising a plurality of openings formed through the substrate and extending to the encapsulant mass, the openings being received within the battery periphery.

12. A radio frequency communication device comprising:

a substrate having conductive paths including an antenna formed thereon;

at least one integrated circuit chip mounted to the substrate and in electrical connection with a first portion of the substrate conductive paths;

a thin profile battery conductively bonded to a second portion of the conductive paths;

an encapsulant mass received over and adhering to the integrated circuit chip, to the thin profile battery and to the substrate;

an opening formed through the substrate and extending to the encapsulant mass; and wherein the battery comprises a periphery and a center, the opening being formed more proximate the periphery than the center.

13. A radio frequency communication device comprising:

a substrate having conductive paths including an antenna formed thereon;

at least one integrated circuit chip mounted to the substrate and in electrical connection with a first portion of the substrate conductive paths;

a thin profile battery conductively bonded to a second portion of the conductive paths;

an encapsulant mass received over and adhering to the integrated circuit chip, to the thin profile battery and to the substrate;

an opening formed through the substrate and extending to the encapsulant mass; and wherein the battery comprises a periphery and a center, the opening being formed more proximate the center than the periphery.

14. A radio frequency communication device comprising:

a substrate having conductive paths including an antenna formed thereon;

at least one integrated circuit chip mounted to the substrate and in electrical connection with a first portion of the substrate conductive paths;

a thin profile battery conductively bonded to a second portion of the conductive paths, the battery comprising a periphery;

an encapsulant mass received over and adhering to the integrated circuit chip, to the thin profile battery and to the substrate; and an opening extending through the substrate from a location proximate the thin profile battery within a region bounded by the battery periphery to externally of the substrate.

15. The radio frequency communication device of claim 14 wherein the opening extends to externally of the substrate within the region bounded by the battery periphery.

16. The radio frequency communication device of claim 14 wherein the substrate is flexible.

17. The radio frequency communication device of claim 14 comprising a plurality of openings formed through the substrate from a location proximate the battery within a region bounded by the battery periphery to externally of the substrate.

18. The radio frequency communication device of claim 14 wherein the battery comprises a center, the opening being formed more proximate the periphery than the center.

19. The radio frequency communication device of claim 14 wherein the battery comprises a center, the opening being formed more proximate the center than the periphery.

* * * * *